(12) United States Patent
Chen

(10) Patent No.: US 9,991,232 B2
(45) Date of Patent: Jun. 5, 2018

(54) PACKAGE AND PACKAGING PROCESS OF A SEMICONDUCTOR DEVICE

(71) Applicant: Winbond Electronics Corp., Taichung (TW)

(72) Inventor: Yu-Ming Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 205 days.

(21) Appl. No.: 15/253,823

(22) Filed: Aug. 31, 2016

(65) Prior Publication Data

US 2018/0005993 A1 Jan. 4, 2018

(30) Foreign Application Priority Data

Jun. 30, 2016 (CN) .......................... 2016 1 0504287

(51) Int. Cl.
| | |
|---|---|
| *H01L 21/00* | (2006.01) |
| *H01L 25/065* | (2006.01) |
| *H01L 23/00* | (2006.01) |
| *H01L 21/56* | (2006.01) |
| *H01L 25/10* | (2006.01) |
| *H01L 25/00* | (2006.01) |

(52) U.S. Cl.
CPC ........ *H01L 25/0657* (2013.01); *H01L 21/563* (2013.01); *H01L 24/05* (2013.01); *H01L 24/09* (2013.01); *H01L 24/17* (2013.01); *H01L 24/27* (2013.01); *H01L 24/29* (2013.01); *H01L 25/105* (2013.01); *H01L 25/50* (2013.01); *H01L 2224/0401* (2013.01); *H01L 2225/06551* (2013.01); *H01L 2225/06562* (2013.01)

(58) Field of Classification Search
CPC ... H01L 23/02; H01L 23/3675; H01L 21/565; H01L 2924/15153; H01L 2224/32145; H01L 24/28; H01L 2924/1627
USPC ........ 438/106, 107, 109, 118, 127; 257/686, 257/777, 782, 787
See application file for complete search history.

(56) References Cited

U.S. PATENT DOCUMENTS

| | | | |
|---|---|---|---|
| 6,340,842 B1 | 1/2002 | Nakamura | |
| 6,472,732 B1 * | 10/2002 | Terui | ...................... H01L 23/13 257/678 |

(Continued)

FOREIGN PATENT DOCUMENTS

TW 201112384 4/2011

OTHER PUBLICATIONS

"Office Action of Taiwan Counterpart Application," dated Dec. 16, 2016, p. 1-p. 7.

(Continued)

*Primary Examiner* — S. V. Clark
(74) *Attorney, Agent, or Firm* — JCIPRNET

(57) ABSTRACT

A packaging process of a semiconductor device includes following steps. A patterned conductive layer and a solder resist layer that covers the patterned conductive layer are formed through 3D-printing over a carrier having a cavity. The patterned conductive layer and the solder resist layer extend to the outside of the cavity from the inside of the cavity. One portion of the patterned conductive layer is exposed by the solder resist layer. At least one semiconductor device is mounted on the patterned conductive layer in the cavity, such that the at least one semiconductor device is electrically connected to the patterned conductive layer.

15 Claims, 12 Drawing Sheets

(56) References Cited

U.S. PATENT DOCUMENTS

| | | | | |
|---|---|---|---|---|
| 7,786,591 B2* | 8/2010 | Khan | ................... | H01L 23/13 257/668 |
| 8,115,112 B2* | 2/2012 | Corisis | ................... | H01L 23/13 174/255 |
| 8,354,743 B2* | 1/2013 | Jensen | ................ | H01L 25/0657 257/686 |
| 2001/0048152 A1* | 12/2001 | Moden | ................... | H01L 23/13 257/686 |
| 2002/0079575 A1 | 6/2002 | Hozoji et al. | | |
| 2002/0153604 A1* | 10/2002 | Vaiyapuri | ........... | H01L 23/3114 257/686 |
| 2004/0227222 A1* | 11/2004 | Kikuchi | .............. | H01L 23/5383 257/686 |
| 2009/0014858 A1* | 1/2009 | Boon | ................. | H01L 21/4853 257/686 |
| 2012/0299173 A1* | 11/2012 | Mohammed | ........ | H01L 23/3677 257/686 |
| 2014/0252584 A1 | 9/2014 | Spory | | |
| 2015/0197062 A1 | 7/2015 | Shinar et al. | | |
| 2015/0201489 A1* | 7/2015 | Foong | ................... | H05K 1/097 361/783 |
| 2016/0204073 A1* | 7/2016 | Beak | ................... | H01L 23/295 455/418 |

OTHER PUBLICATIONS

"Office Action of Taiwan Counterpart Application," dated Apr. 21, 2017, p. 1-p. 5.

\* cited by examiner

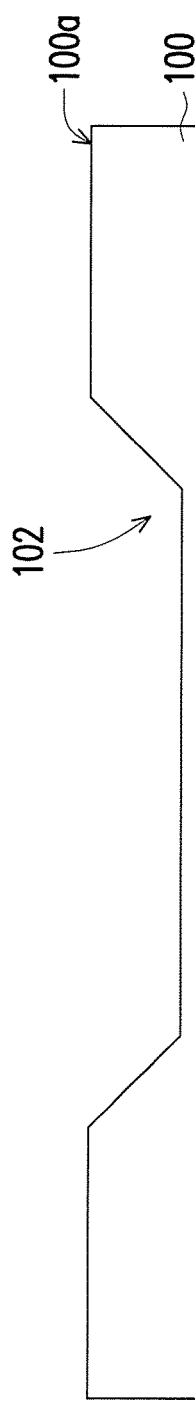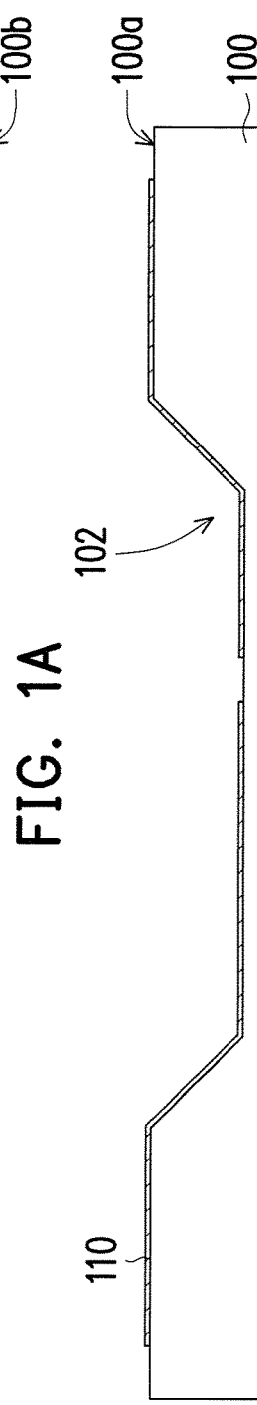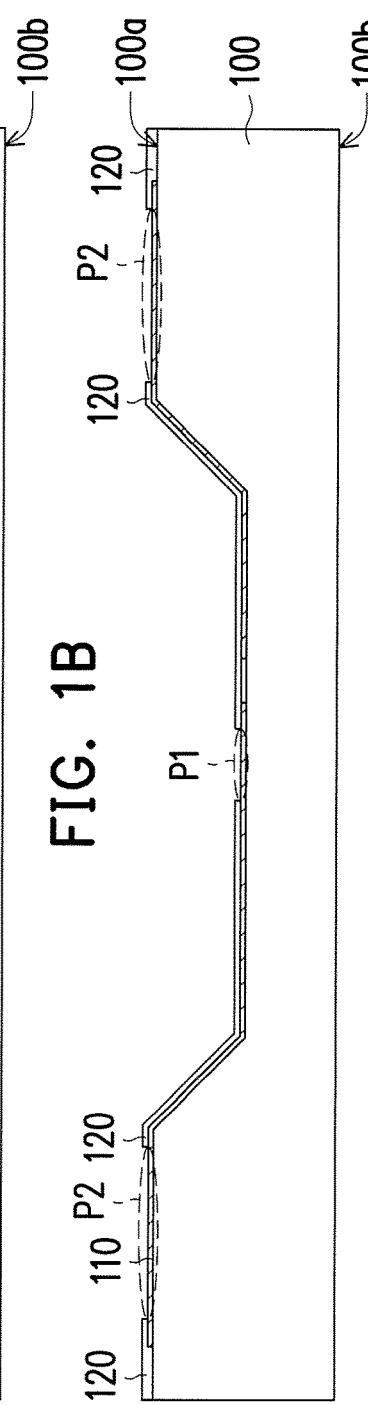

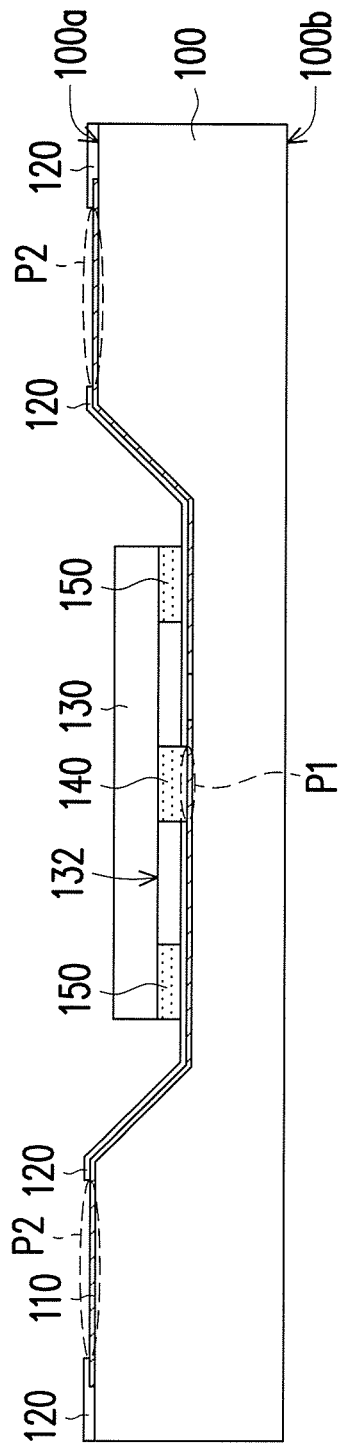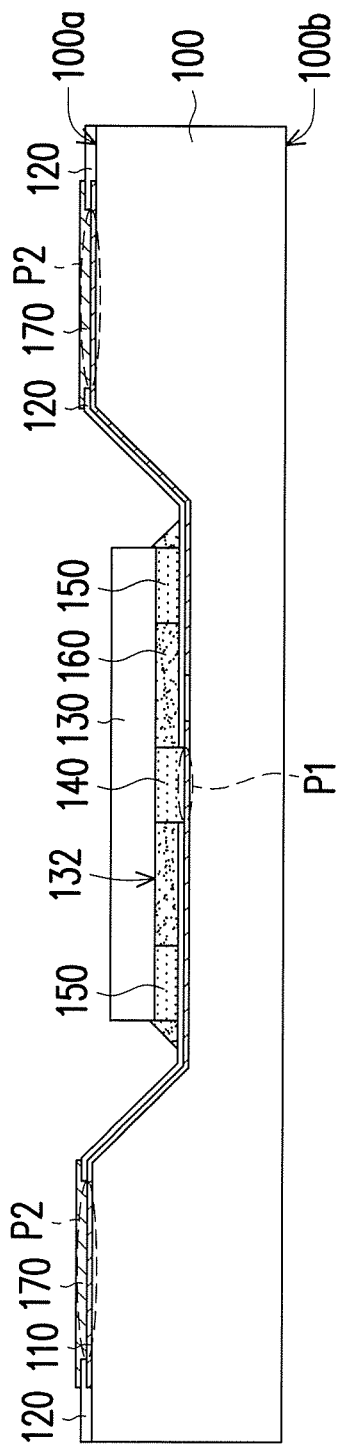

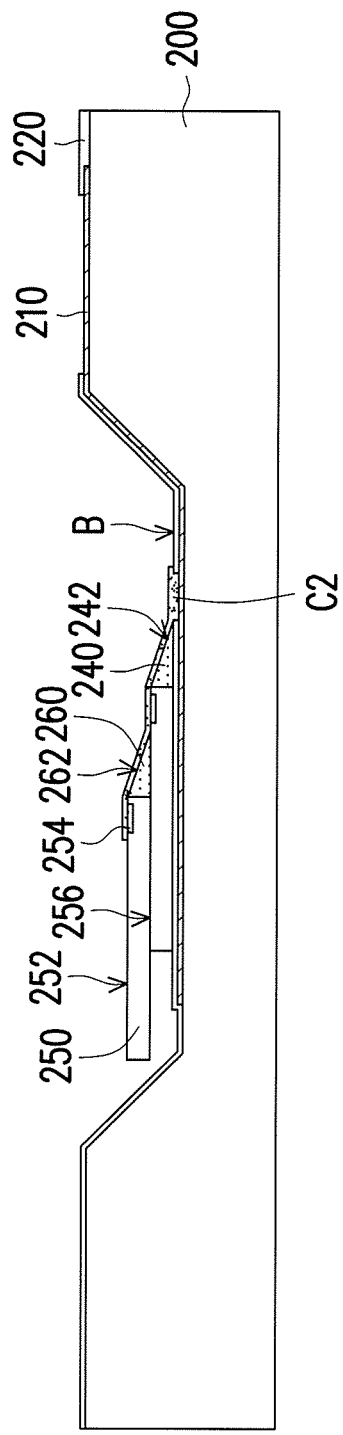
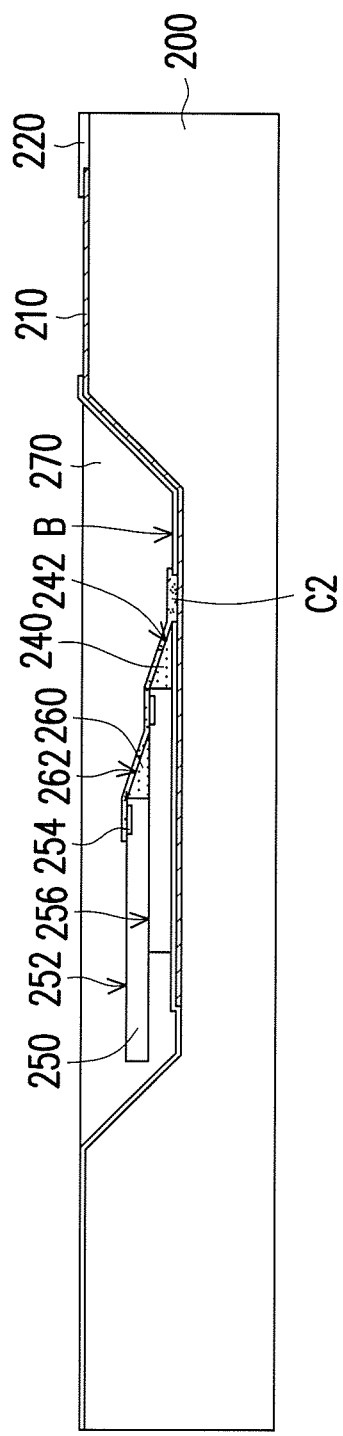
FIG. 7D
FIG. 7E

PACKAGE AND PACKAGING PROCESS OF A SEMICONDUCTOR DEVICE

CROSS-REFERENCE TO RELATED APPLICATION

This application claims the priority benefit of China application serial no. 201610504287.0, filed on Jun. 30, 2016. The entirety of the above-mentioned patent application is hereby incorporated by reference herein and made a part of this specification.

FIELD OF THE INVENTION

The invention relates to a packaging technology; more particularly, the invention relates to a packaging process of a semiconductor device.

DESCRIPTION OF RELATED ART

With the ever-advancing electronic technologies, more and more functionally powerful and personalized products are produced, and various electronic products have been developed to have light weight and compact size. The weight and the volume of an electronic product rely on the weight and the volume of the semiconductor device in the electronic product; hence, light weight and compactness are also taken into consideration during the manufacture and the packaging process of the semiconductor device (e.g., an integrated circuit). The normal packaging process of the semiconductor device includes small outline package (SOP), quad flat package (QFP), ball grid array (BGA) package, and so forth. The design of each of said packages aims at the reduction of the thickness, the volume, and the weight. In addition to the consideration of light weight and compactness, researchers have also been paying attention to packaging costs, manufacturing complexity, packaging yield, etc.

SUMMARY OF INVENTION

The invention is directed to a semiconductor device package and a packaging process of a semiconductor device.

In an embodiment of the invention, a packaging process of a semiconductor device includes following steps. A patterned conductive layer and a solder resist layer that covers the patterned conductive layer are formed through three dimensional (3D)-printing over a carrier having a cavity. The patterned conductive layer and the solder resist layer extend to the outside of the cavity from the inside of the cavity. One portion of the patterned conductive layer is exposed by the solder resist layer. At least one semiconductor device is mounted on the patterned conductive layer in the cavity, such that the at least one semiconductor device is electrically connected to the patterned conductive layer.

In an embodiment of the invention, a semiconductor device package that includes a carrier, a patterned conductive layer, a solder resist layer, a first semiconductor device, a first extension structure, and a plurality of connecting traces is provided. The carrier has a cavity. The solder resist layer covers the patterned conductive layer, wherein the patterned conductive layer and the solder resist layer extend from an inside of the cavity to an outside of the cavity, and one portion of the patterned conductive layer is exposed by the solder resist layer. The first semiconductor device is mounted on the patterned conductive layer in the cavity, wherein the first semiconductor device has a first back surface facing the carrier and a first active surface opposite to the first back surface. The first extension structure is disposed on a bottom surface of the cavity, and the first extension structure has a first layout surface connecting the first active surface and the bottom surface. The connecting traces are disposed on the first active surface, the first layout surface, and the bottom surface, such that the connecting traces are electrically connected between the first semiconductor device and the patterned conductive layer in the cavity.

In view of the above, the patterned conductive layer and the solder resist layer can be easily formed through 3D-printing on the carrier having the cavity; because of the 3D-printing technology, the manufacturing complexity of the package can be lessened.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1F are schematic views illustrating a packaging process of a semiconductor device according to a first embodiment of the invention.

FIG. 7A to FIG. 7E are schematic views illustrating a packaging process of a semiconductor device according to a fifth embodiment of the invention.

DETAILED DESCRIPTION OF DISCLOSED EMBODIMENTS

First Embodiment

Figure 1F:
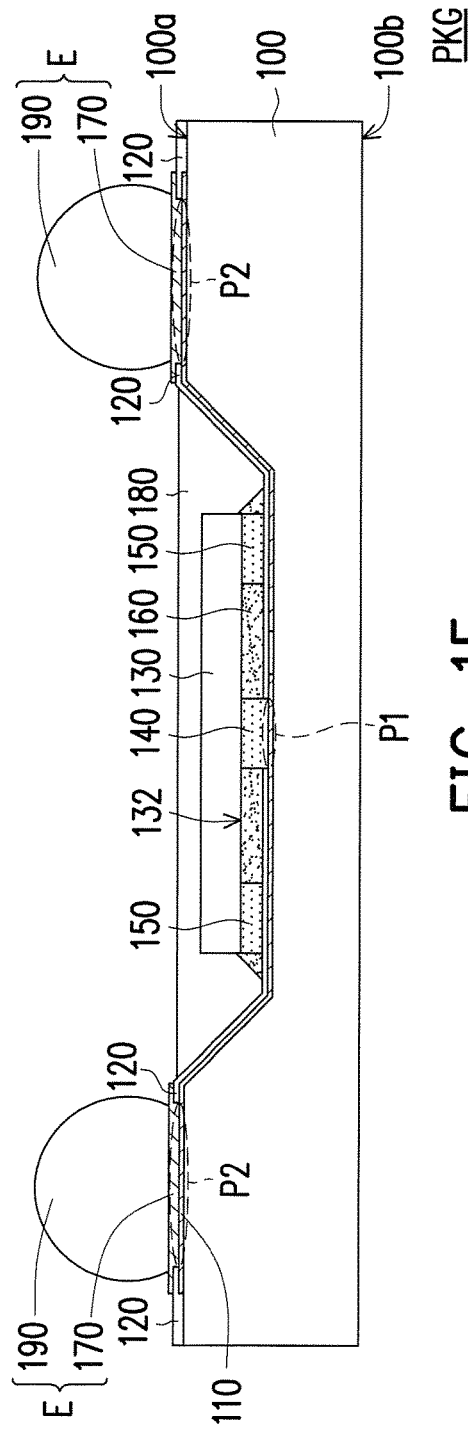

FIG. 1A to FIG. 1F are schematic views illustrating a packaging process of a semiconductor device according to a first embodiment of the invention. FIG. 1G and FIG. 1H are top schematic views of FIG. 1B and FIG. 1C, respectively.

With reference to FIG. 1A, a carrier 100 is provided. The carrier 100 has a first insulation surface 100a, a second insulation surface 100b opposite to the first insulation surface 100a, and a cavity 102 located on the first insulation surface 100a. In an embodiment of the invention, the carrier 100 may be a dielectric core layer, and the cavity 102 is formed on one surface of the dielectric core layer. For instance, a material of the dielectric core layer is plastic, ceramics, glass, or another dielectric material. In another embodiment of the invention, the carrier 100 may be a conductive core layer. The cavity 102 is formed on one surface of the conductive core layer, and the conductive core layer having the cavity 102 is encapsulated by one or multiple dielectric layers (not shown), such that the subsequently formed patterned conductive layer can be electrically insulated from the conductive core layer. The conductive core layer is, for instance, made of copper or a conductive material that can achieve favorable heat-conducting effects. The carrier 100 having the dielectric core layer and the carrier 100 having the conductive core layer encapsulated by the dielectric layer(s) are both insulation carriers.

As shown in FIG. 1B and FIG. 1G, a patterned conductive layer 110 is formed on the carrier 100 having the cavity 102 through 3D-printing. In the present embodiment, the patterned conductive layer 110 is disposed on the first insulation surface 100a of the carrier 100, and the patterned conductive layer 110 extend from the inside of the cavity to the outside of the cavity 102. As shown in FIG. 1G, the patterned conductive layer 110 provided in the present embodiment includes a plurality of conductive lines CL extending from the inside of the cavity 102 to the outside of the cavity 102, and each of the conductive lines CL includes a first pad P1, a second pad P2, and a conductive trace T. The first pads P1 are distributed in the cavity 102, the second pads P2 are distributed outside the cavity 102, and the conductive traces T extend from the inside of the cavity 102 to the outside of the cavity 102, such that the conductive traces T are connected between the corresponding first pads P1 and the corresponding second pads P2. In the present embodiment, the number of the conductive lines CL and the layout of the conductive lines CL can be modified according to actual design requirements.

As exemplified in FIG. 1G, each conductive line CL is electrically insulated from one another, for instance. The first pads P1 of the conductive lines CL are arranged in the central area of the cavity 102 in a concentrated manner, and the second pads P2 of the conductive lines CL are arranged on two sides of the cavity 102 in a distributed manner. The interval of the first pads P1 is often smaller than the interval of the second pads P2. In the present embodiment, the patterned conductive layer 110 having the conductive lines CL can be considered as a fan-out circuit.

With reference to FIG. 1C and FIG. 1H, after the patterned conductive layer 120 is formed through printing, a solder resist layer 120 is formed on the carrier 100 having the cavity 102 through 3D-printing. In the present embodiment, the solder resist layer 120 is arranged on the first insulation surface 100a of the carrier 100, and the solder resist layer 120 extend from the inside of the cavity to the outside of the cavity 102. As shown in FIG. 1H, the solder resist layer 120 provided in the present embodiment covers the patterned conductive layer 110 and the first insulation surface 100a of the carrier 100, so as to protect the conductive lines CL, and the solder resist layer 120 has a plurality of openings corresponding to the first pads P1 and P2, so as to expose the first pads P1 and the second pads P2.

With reference to FIG. 1D, at least one semiconductor device 130 is mounted on the patterned conductive layer 110 in the cavity 102, and the least one semiconductor device 130 is electrically connected to the first pads P1 of the patterned conductive layer 110. In the present embodiment, the semiconductor device 130 has a plurality of bonding pads, for instance, and the bonding pads of the semiconductor device 130 can be arranged according to actual design requirements. In the present embodiment, the bonding pads of the semiconductor device 130 are arranged on the active surface 132 of the semiconductor device 130 in a concentrated manner, and the bonding pads are arranged in one row or in rows. In other embodiments, the bonding pads of the semiconductor device 130 may be evenly distributed on the active surface 132 of the semiconductor device 130 or distributed close to an edge of the active surface 132 of the semiconductor device 130. Note that the arrangement (e.g., the location and the interval) of the first pads P1 should correspond to the arrangement of the bonding pads of the semiconductor device 130 according to the present embodiment. That is, in response to different subjects to be packaged, i.e., the semiconductor devices 130 whose bonding pads are arranged in a different manner, the patterned conductive layer 110 on the carrier 100 can be appropriately modified.

In the present embodiment, as shown in FIG. 1D, the semiconductor device 130 can be electrically connected to the patterned conductive layer 110 through a plurality of conductive bumps 140. In particular, the semiconductor device 130 is a flip chip having the conductive bumps 140. The active surface 132 of the semiconductor device 130 faces the carrier 100 and is bonded to the first pads P1. In an embodiment of the invention, if the bonding pads of the semiconductor device 130 are arranged on the active surface 132 of the semiconductor device 130 in a concentrated manner, support bumps 150 can be arranged between the patterned conductive layer 110 and the edge of the active surface 132 of the semiconductor device 130, such that the bonding between the semiconductor device 130 and the first pad P1 can succeed, and that the semiconductor device 130 does not lean to one side. The conductive bumps 140 and the support bumps 150 are formed by performing the same bumping process. In other words, the conductive bumps 140 and the support bumps 150 are made of the same material. In other feasible embodiments, the support bumps 150 may be made of a non-conductive material, and it is not required for the support bumps 150 to be formed together with the conductive bumps 140.

It should be mentioned that if the conductive bumps 140 between the semiconductor device 130 and the patterned conductive layer 110 can stably hold the semiconductor device 130 and ensure that the semiconductor device 130 does not lean to one side during the process of bonding the semiconductor device 130 to the patterned conductive layer 110, the support bumps 150 can be omitted. For instance, if the bonding pads of the semiconductor device 130 are evenly distributed on the active surface 132 of the semiconductor device 130 or distributed close to the edge of the active surface 132 of the semiconductor device 130, the process of bonding the semiconductor device 130 to the patterned conductive layer 110 does not require any support bump 150.

After the semiconductor device 130 and the patterned conductive layer 110 on the carrier 100 are electrically connected, the packaging process of the semiconductor device 130 is completed.

With reference to FIG. 1E, after the semiconductor device 130 and the patterned conductive layer 110 are completely bonded, an underfill material 160 is formed between the semiconductor device 130 and the carrier 100 to encapsulate the conductive bumps 140. In the present embodiment, the underfill material 160 can serve to protect the semiconductor device 130, the conductive bumps 140, and the patterned conductive layer 110. Besides, when sheer stress is generated due to the CTE mismatch between the semiconductor device 130 and the patterned conductive layer 110, the conductive bumps 140 are fatigued or broken because of the sheer stress. At this time, the underfill material 160 can relieve the sheer stress on the conductive bumps 140 and thus protect the conductive bumps 140. For instance, the underfill material 160 is a dielectric material that can achieve favorable heat-conducting and insulation effects, and the underfill material 160 is made of epoxy, for instance.

As shown in FIG. 1E, after the semiconductor device 130 and the patterned conductive layer 110 are completely bonded, a surface treatment layer 170 may be selectively formed on the second pads P2. The surface treatment layer 170 is a conductor layer and is electrically connected to the second pads P2. In the present embodiment, the surface treatment layer 170 not only covers the second pads P2 but also covers a portion of the solder resist layer 120, so as to protect the second pads P2. Note that the order of manufacturing the underfill material 160 and the surface treatment layer 170 is not limited in the present embodiment.

Figure 1G:
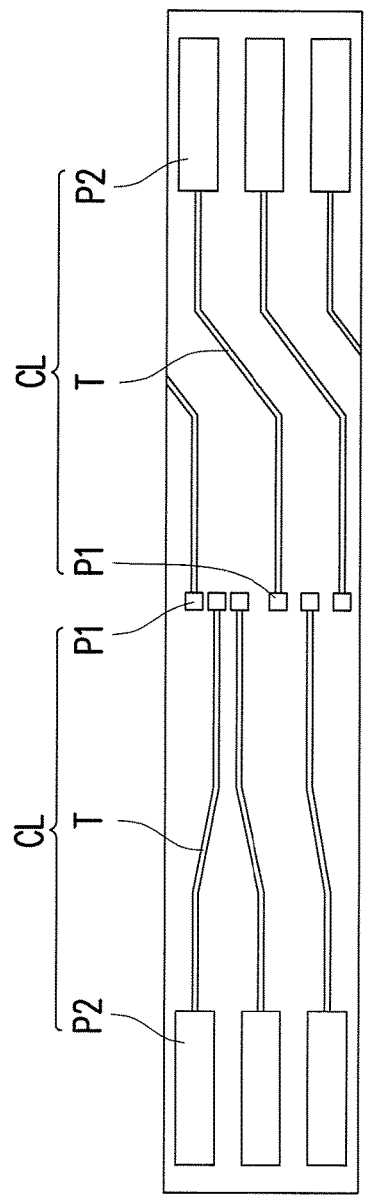
FIG. 1G and FIG. 1H are top schematic views of FIG. 1B and FIG. 1C, respectively.
Figure 1H:
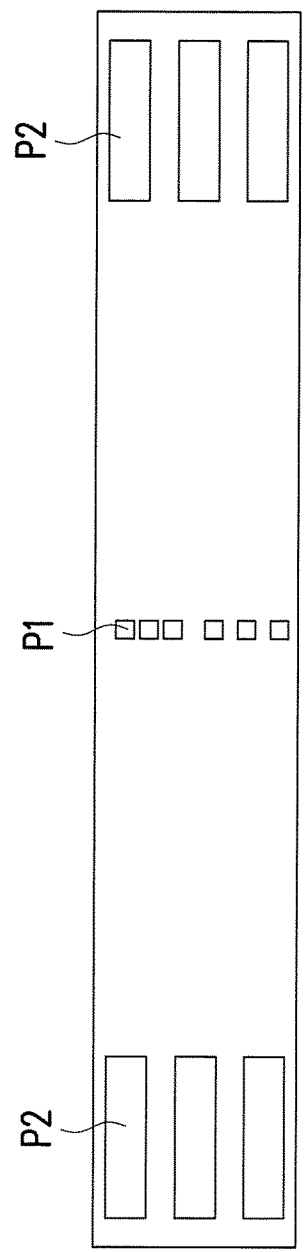

With reference to FIG. 1F, after the underfill material 160 is completely generated, the cavity 102 of the carrier 100 is filled with a packaging material 180, so as to encapsulate the underfill material 160 and the semiconductor device 130 in the cavity 102. In the present embodiment, the cavity 102 is completely filled with the packaging material 180. The packaging material 180 has a planar upper surface slightly higher than the first insulation surface 100a of the carrier 100. In other feasible embodiments, the upper surface of the packaging material 180 may be slightly lower than the first insulation surface 100a of the carrier 100 or aligned with the first insulation surface 100a of the carrier 100.

Besides, as shown in FIG. 1F, after the underfill material 160 is completely generated, a solder ball 190 electrically connected to the patterned conductive layer 110 is formed on the carrier 100 excluding the cavity 102. According to the present embodiment, the solder ball 190 is electrically connected to the second pads P2 through the surface treatment layer 170, and the solder ball 190 and the surface treatment layer 170 electrically connected to the second pads P2 may be considered as an external circuit E. It should be mentioned that the order of manufacturing the packaging material 180 and the solder ball 190 is not limited in the present embodiment.

Figure 1I:
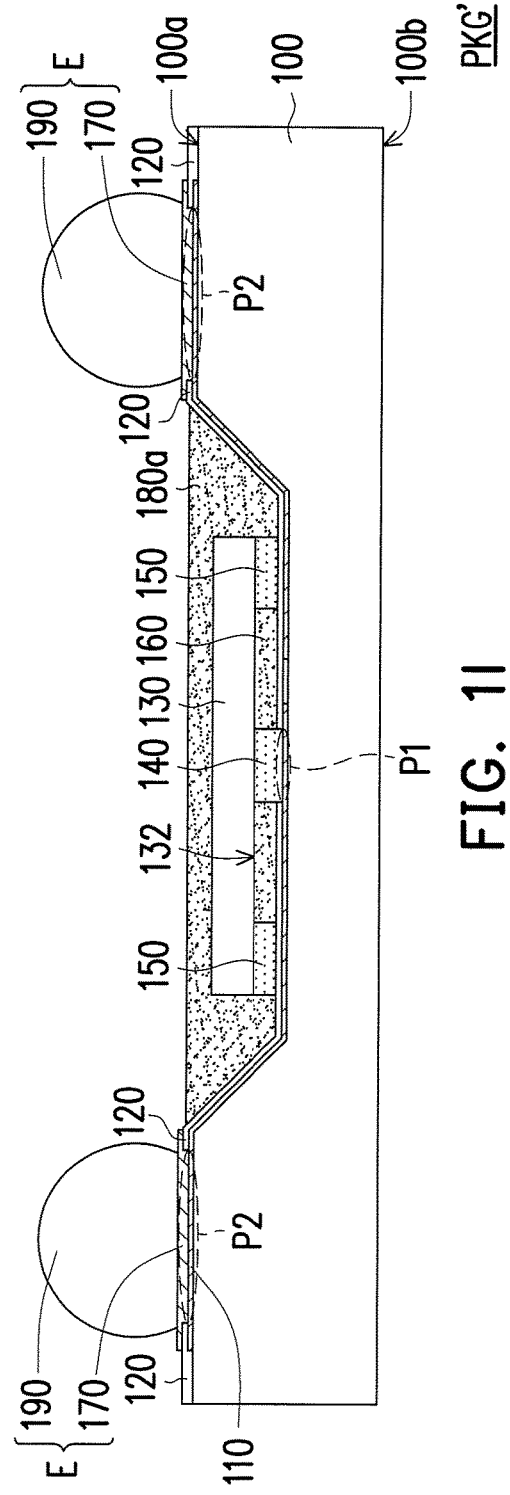
FIG. 1I and FIG. 1J are schematic cross-sectional views illustrating another semiconductor device package according to the first embodiment of the invention.
Figure 1J:
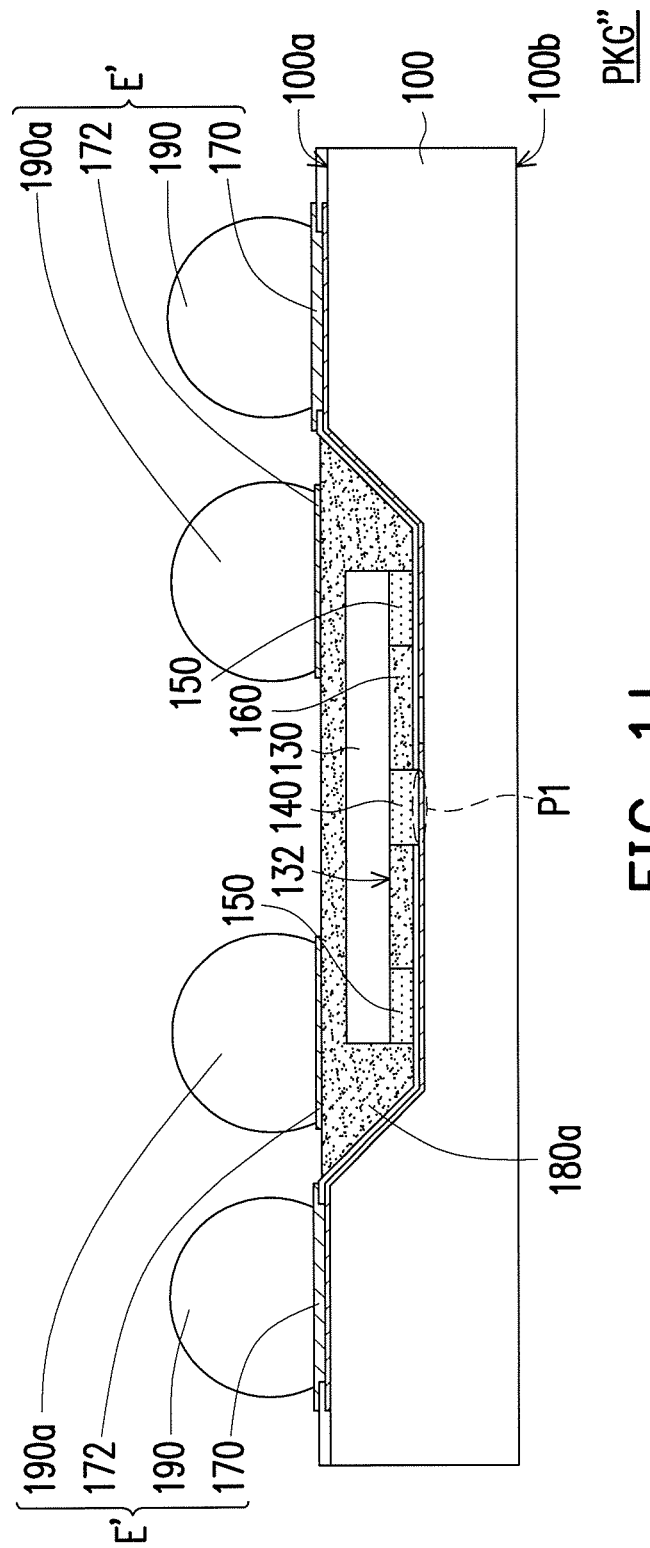

FIG. 1I and FIG. 1J are schematic cross-sectional views illustrating another semiconductor device package according to the first embodiment of the invention. With reference to FIG. 1I, the semiconductor device package PKG' shown in FIG. 1I is similar to the semiconductor device package PKG shown in FIG. 1F, whereas the difference therebetween lies in that the semiconductor device package PKG' shown in FIG. 1I does not have any underfill material 160; instead, the space between the semiconductor device 130 and the carrier 100 is filled with the packaging material 180a, so as to encapsulate the conductive bumps 140. In addition, the packaging material 180a further encapsulates the semiconductor device 130 located in the cavity 102. Namely, the packaging material 180a shown in FIG. 1I replaces the packaging material 180 and the underfill material 160 shown in FIG. 1F.

With reference to FIG. 1J, the semiconductor device package PKG'' depicted in FIG. 1J is similar to the semiconductor device package PKG' depicted in FIG. 1I, whereas the difference therebetween lies in that the external circuit E' shown in FIG. 1J not only includes the solder ball 190 and the surface treatment layer 170 electrically connected to the second pads P2 but also includes a circuit layer 172 located on the packaging material 180a and the solder ball 190a located on the circuit layer 172, and the circuit layer 172 and the solder ball 190a are also electrically connected to the second pads P2. That is, the external circuit E' shown in FIG. 1J is not only located on the carrier 100 excluding the cavity 102 but also formed on the packaging material 180a filling the cavity 102. Hence, the layout of the solder ball 190a can be more flexible.

Second Embodiment

Figure 2:
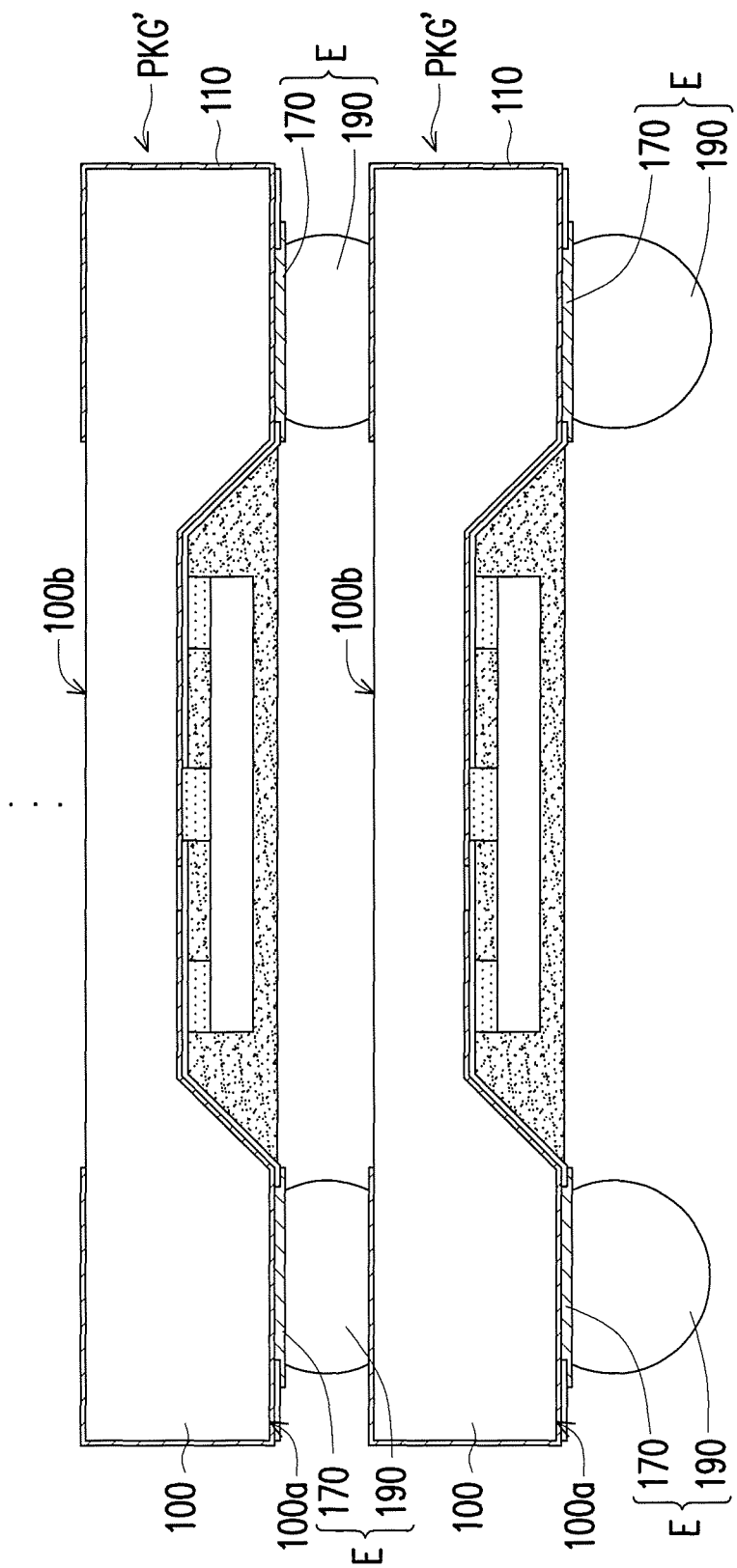
FIG. 2 and FIG. 3 are schematic views illustrating a semiconductor device package according to a second embodiment of the invention.
Figure 3:
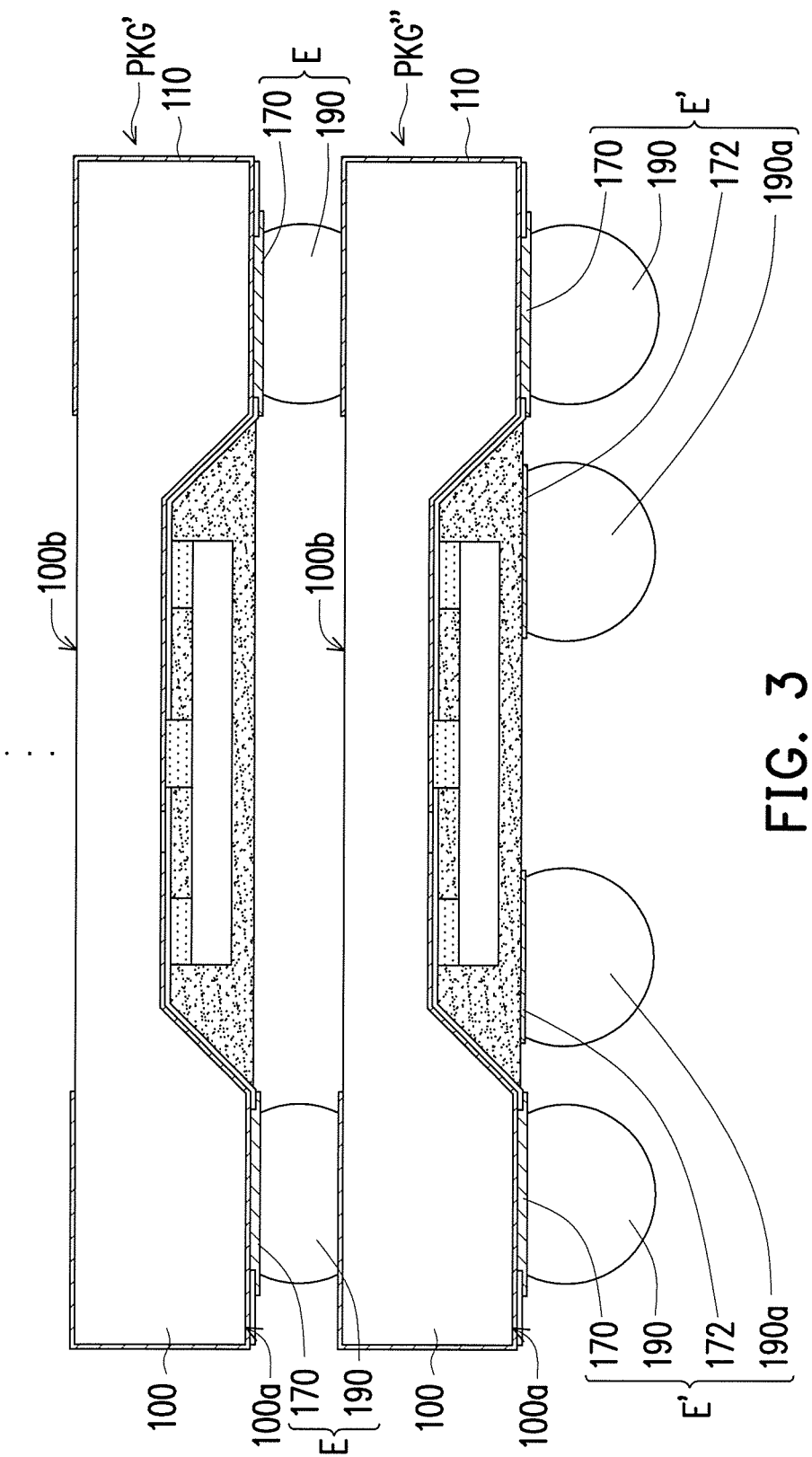

FIG. 2 and FIG. 3 are schematic views illustrating a semiconductor device package according to a second embodiment of the invention. To stack plural semiconductor device packages, the patterned conductive layer 110 in each of the semiconductor device packages PKG' and PKG'' can further extend to the second insulation surface 100b of the carrier 100.

As shown in FIG. 2, the two semiconductor device packages PKG' and PKG' can be stacked together through the connection of the patterned conductive layer 110. Similarly, as shown in FIG. 3, the semiconductor device package PKG' can be stacked onto the semiconductor device package PKG'' through the connection of the patterned conductive layer 110. Note that the type of the semiconductor device package is not limited in the present embodiment; that is, the semiconductor device packages PKG, PKG', and PKG'' can all be applied for the stacking purposes; in addition, the number of the semiconductor device packages is not limited herein.

Third Embodiment

Figure 4:
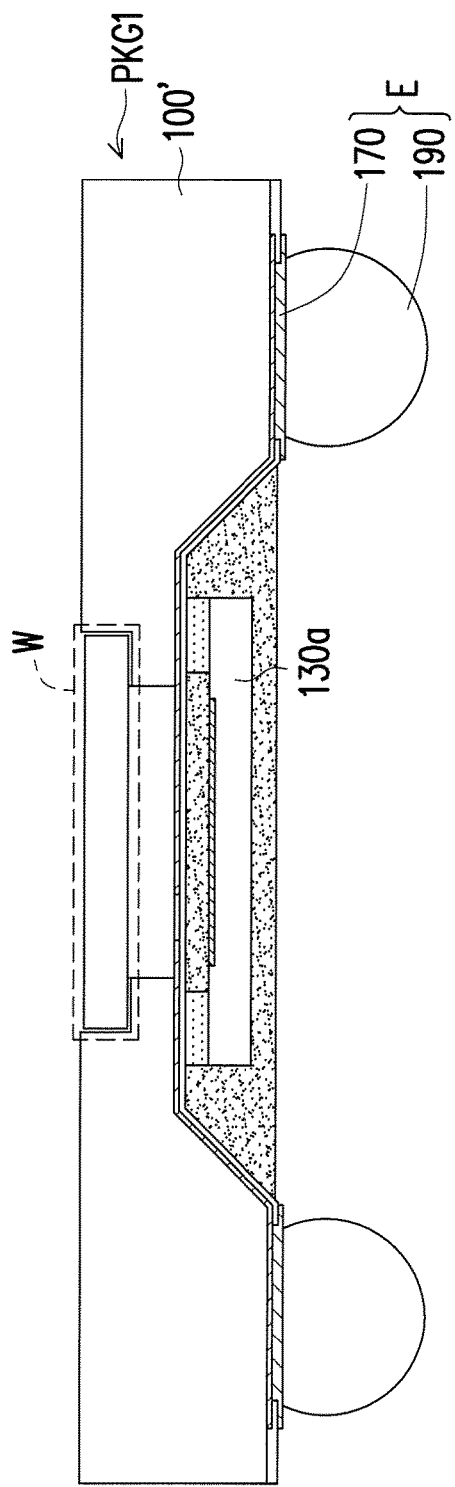
FIG. 4 and FIG. 5 are schematic views illustrating a semiconductor device package according to a third embodiment of the invention.
Figure 5:
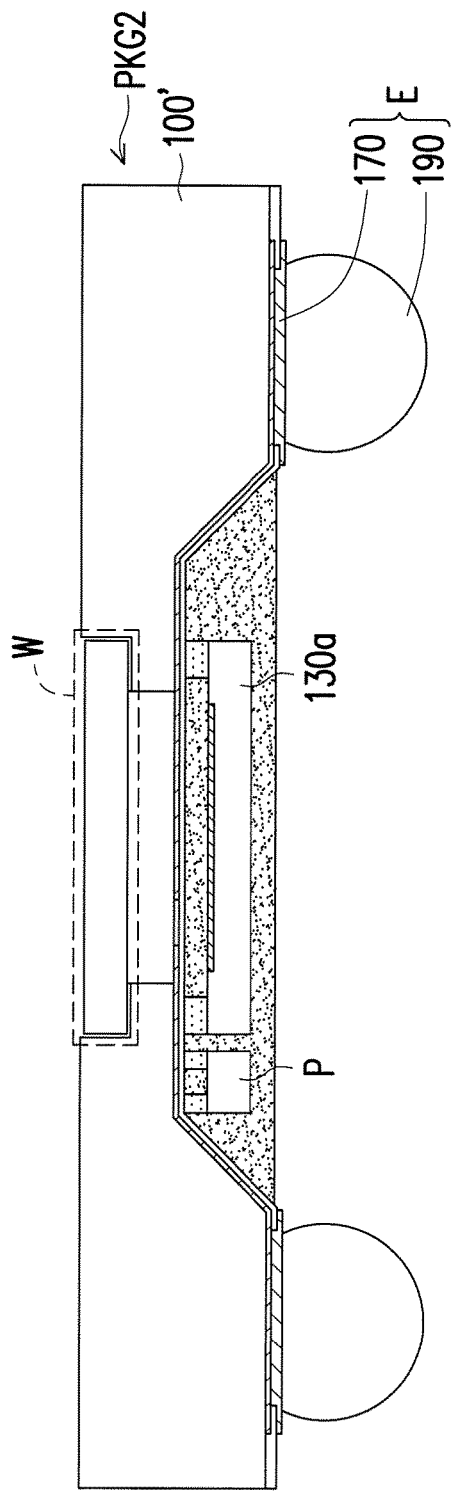

FIG. 4 and FIG. 5 are schematic views illustrating a semiconductor device package according to a third embodiment of the invention. With reference to FIG. 4, the semiconductor device package PKG1 provided in the present embodiment is similar to the semiconductor device package PKG' provided in the first embodiment, whereas the difference therebetween lies in the type of the semiconductor device 130a and the structure of the carrier 100'.

In the present embodiment, the semiconductor device 130a applied in the semiconductor device package PKG1 is an optical semiconductor device, such as a photosensitive device, a light emitting device, and a fingerprint recognition device. In order for the semiconductor device 130a to receive light coming from the outside of the semiconductor device package PKG1 or for the light emitted from the semiconductor device 130a to be transmitted to the outside of the semiconductor device package PKG1, the carrier 100' provided in the present embodiment has an optical window W that permits penetration of light. In the present embodiment, the optical window W may be a glass substrate, a plastic substrate, or any other transparent substrate that can be embedded into the carrier 100'.

With reference to FIG. 5, the semiconductor device package PKG2 provided in the present embodiment is similar to the semiconductor device package PKG1, whereas the difference therebetween lies in that the semiconductor device package PKG2 further includes at least one passive device P located in the cavity 102 or any other above-mentioned electronic device encapsulated by the packaging material 180a. In the semiconductor device package PKG2, it should be mentioned that the passive device P or any other electronic device may be electrically connected to the semiconductor device 130a through the patterned conductive layer 110 according to actual design requirements.

The proper design of the patterned conductive layer 110 allows the semiconductor device packages PKG, PKG', and PKG" of different types to be stacked together, so as to form the required stacked package.

Fourth Embodiment

Figure 6A:
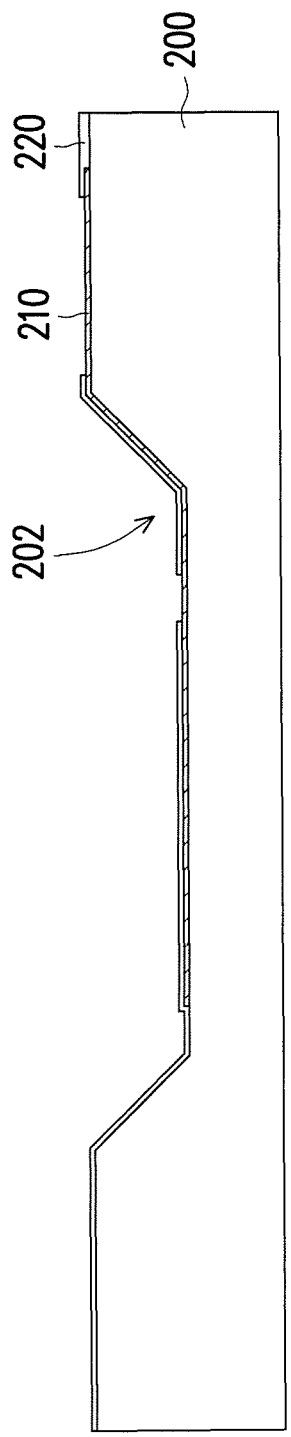
FIG. 6A to FIG. 6D are schematic views illustrating a packaging process of a semiconductor device according to a fourth embodiment of the invention.

FIG. 6A to FIG. 6D are schematic views illustrating a packaging process of a semiconductor device according to a fourth embodiment of the invention. With reference to FIG. 6A, a carrier 200 having a cavity 202 is provided, and a patterned conductive layer 210 and a solder resist layer 220 are formed on the carrier 200 having the cavity 202 through 3D-printing. The manufacture of the carrier 200, the patterned conductive layer 210, and the solder resist layer 220 is similar to that provided in the first embodiment and thus will not be explained hereinafter.

Figure 6B:
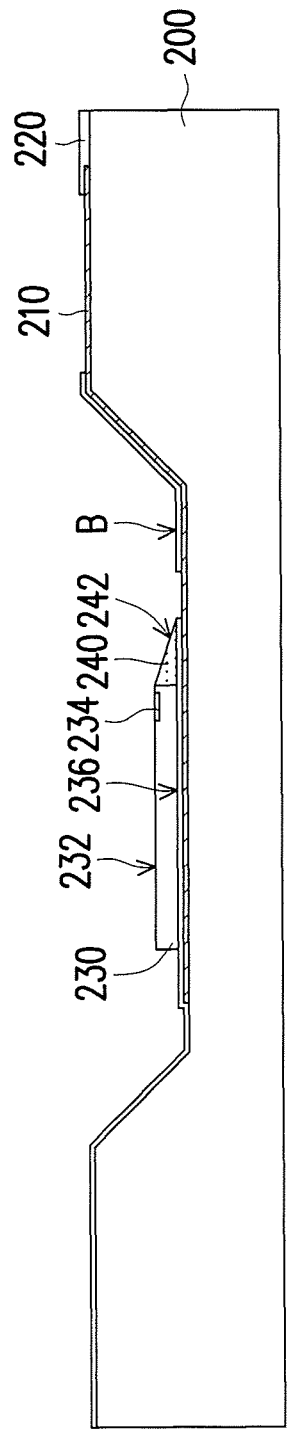

With reference to FIG. 6B, a first semiconductor device 230 is mounted on the patterned conductive layer 110 in the cavity 202, and a first back surface 236 of the first semiconductor device 230 faces the carrier 200. That is, the first semiconductor device 230 (of which the first active surface 232 faces upward) is arranged in the cavity 202 of the carrier 200, and the first semiconductor device 230 has a plurality of first bonding pads 234 distributed onto the first active surface 232. A first extension structure 240 is formed in the cavity 202. The first extension structure 240 has a first layout surface 242 connecting the first active surface 232 of the first semiconductor device 230 and a bottom surface B of the cavity 202. In the present embodiment, the first layout surface 242 is a plane tilting with respect to the bottom surface B, for instance. According to other feasible embodiments, the first layout surface 242 may be a curved surface.

As shown in FIG. 6B, the first extension structure 240 is, for instance, formed on the solder resist layer 220 and adjoins one sidewall of the first semiconductor device 230; hence, the first extension structure 240 can be smoothly connected between the first active surface 232 of the first semiconductor device 230 and the bottom surface B of the cavity 202. In the present embodiment, the first extension structure 240 is made of epoxy or any other similar dielectric material, for instance, and the first extension structure 230 is formed on the solder resist layer 220 through 3D-printing, for instance.

Figure 6C:
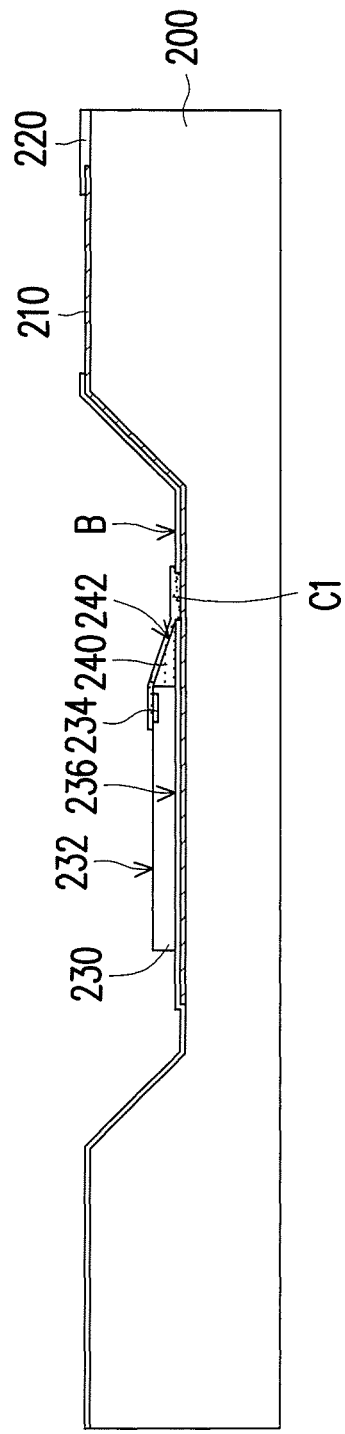

With reference to FIG. 6C, plural connecting traces C1 are formed on the first active surface 232, the first layout surface 242, and the bottom surface B through 3D-printing. Here, the connecting traces C1 are electrically connected between the first bonding pads 234 of the first semiconductor device 230 and the patterned conductive layer 210 in the cavity 202. In the present embodiment, the connecting traces C1 formed through 3D-printing can be stably disposed on the first layout surface 242 of the first extension structure 240. Compared to the conventional wires with certain loop height, the connecting traces C1 provided herein are conducive to the reduction of the overall thickness of the resultant package.

Figure 6D:
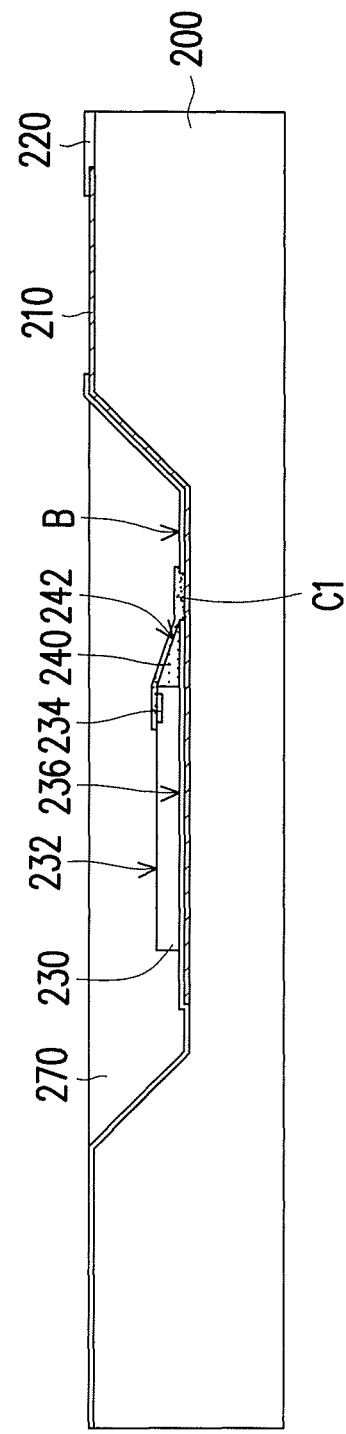

With reference to FIG. 6D, after the connecting traces C1 are completely formed, the cavity 202 is filled with a packaging material 270, so as to encapsulate the first semiconductor device 230, the first extension structure 240, and the connecting traces C1. In the present embodiment, the cavity 202 is filled with the packaging material 270, and the packaging material 270 has the planar upper surface, for instance.

Fifth Embodiment

Figure 7A:
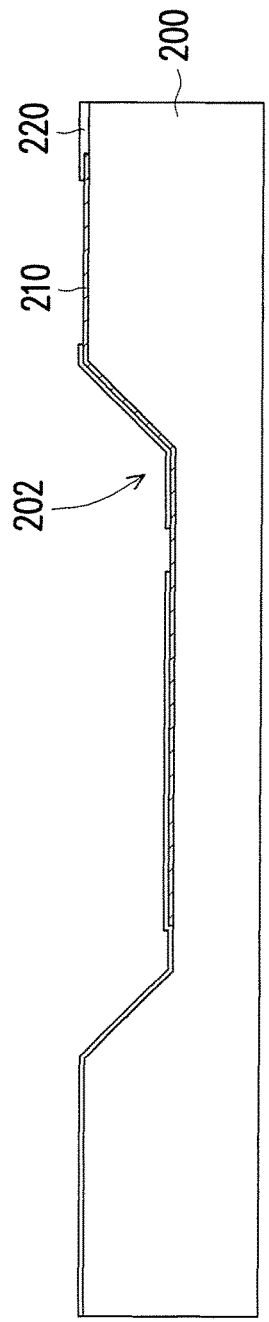
Figure 7B:
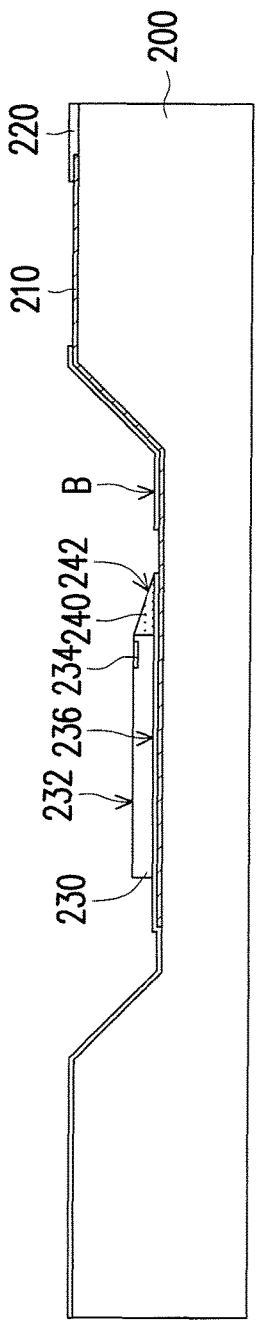

FIG. 7A to FIG. 7E are schematic views illustrating a packaging process of a semiconductor device according to a fifth embodiment of the invention. With reference to FIG. 7A and FIG. 7B, the carrier 200 having the cavity 202 is provided, and the patterned conductive layer 210 and the solder resist layer 220 are formed on the carrier 200 having the cavity 202 through 3D-printing. The first semiconductor device 230 is mounted in the cavity 202, and the first extension structure 240 is formed. The carrier 200, the patterned conductive layer 210, the solder resist layer 220, the first semiconductor device 230, and the first extension structure 240 provided herein are similar to those provided in the fourth embodiment and thus will not be explained hereinafter.

Figure 7C:
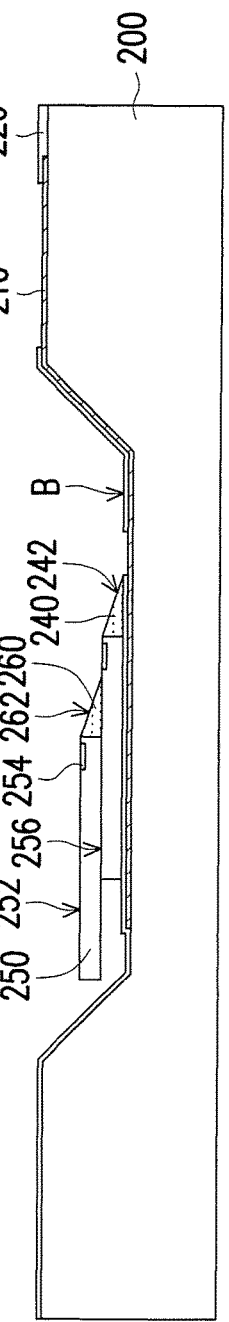

With reference to FIG. 7C, the second semiconductor device 250 (of which the second back surface 256 faces the carrier 200) is mounted in the cavity 202, such that the second semiconductor device 250 is stacked on the first active surface 232 of the first semiconductor device 230. The first bonding pads 234 of the first semiconductor device 230 are not covered by the second semiconductor device 250. Namely, the second semiconductor device 250 (of which the second active surface 252 faces upward) is arranged in the cavity 202 of the carrier 200, and the second semiconductor device 250 has a plurality of second bonding pads 254 distributed onto the second active surface 252. A second extension structure 260 is formed in the cavity 202. The second extension structure 260 has a second layout surface 262 connecting the second active surface 252 of the second semiconductor device 250 and the first active surface 232 of the first semiconductor device 230. In the present embodiment, the second layout surface 262 is a plane tilting with respect to the bottom surface B, for instance. According to other feasible embodiments, the second layout surface 262 may be a curved surface.

The second extension structure 260 is, for instance, formed on the first active surface 232 of the first semiconductor device 230 and adjoins one sidewall of the second semiconductor device 250; hence, the second extension structure 240 can be smoothly connected between the first active surface 232 of the first semiconductor device 230 and the second active surface 252 of the second semiconductor device 250. In the present embodiment, the second extension structure 260 is made of epoxy or any other similar dielectric material, for instance, and the second extension structure 260 is formed on the first active surface 232 through 3D-printing, for instance.

With reference to FIG. 7D, plural connecting traces C2 are formed on the second active surface 252, the second layout surface 262, the first active surface 232, the first layout surface 242, and the bottom surface B through 3D-printing. Here, the connecting traces C2 are electrically connected among the second bonding pads 254 of the second semiconductor device 250, the first bonding pads 234 of the first semiconductor device 230, and the patterned conductive layer 210 in the cavity 202. In the present embodiment, the connecting traces C2 formed through 3D-printing can be stably disposed on the first layout surface 260 of the second extension structure 262. Compared to the conventional wires with certain loop height, the connecting traces C2 provided herein are conducive to the reduction of the overall thickness of the resultant package.

With reference to FIG. 7E, after the connecting traces C2 are completely formed, the cavity 202 is filled with a packaging material 270, so as to encapsulate the first semiconductor device 230, the first extension structure 240, the second semiconductor device 250, the second extension structure 260, and the connecting traces C2. In the present embodiment, the cavity 202 is filled with the packaging material 270, and the packaging material 270 has the planar upper surface, for instance.

In the fourth embodiment and the fifth embodiment, to ensure the packages to be stacked together, the patterned conductive layer 210 can selectively extend to the other surface of the carrier 200. Here, the design of the patterned conductive layer 210 is similar to the design of the patterned conductive layer 110 provided in FIG. 2 or FIG. 3, and the external circuit is distributed on the packaging material 270 and the carrier 200 excluding the cavity 202 (similar to the external circuit E' shown in FIG. 1J) or merely distributed on the carrier 200 excluding the cavity 202 (similar to the external circuit E shown in FIG. 1I).

To sum up, the patterned conductive layer and the solder resist layer can be easily formed through 3D-printing on the carrier having the cavity; because of the 3D-printing technology, the manufacturing complexity of the 3D package can be lessened. In some embodiments of the invention, the connecting traces can be formed in the cavity of the carrier through 3D-printing, which is conducive to the reduction of the overall thickness of the semiconductor device package.

Although the disclosure has been provided with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A packaging process of a semiconductor device, comprising:
    forming a patterned conductive layer and a solder resist layer through three-dimensional printing over a carrier having a cavity, wherein the solder resist layer covers the patterned conductive layer, the patterned conductive layer and the solder resist layer extend to an outside of the cavity from an inside of the cavity, and one portion of the patterned conductive layer is exposed by the solder resist layer;
    mounting at least one semiconductor device on the patterned conductive layer in the cavity, such that the at least one semiconductor device is electrically connected to the patterned conductive layer;
    forming at least one tapered extension structure in the cavity, wherein the at least one tapered extension structure has a inclined layout surface, and the inclined layout surface of the at least one tapered extension structure extends from an active surface of the first semiconductor device to a bottom surface of the cavity; and
    forming a plurality of connecting traces on the active surface, the inclined layout surface, and the bottom surface through three-dimensional printing, wherein the connecting traces are electrically connected between the semiconductor device and the patterned conductive layer in the cavity.

2. The packaging process according to claim 1, wherein a method of forming the carrier comprises:
    providing a dielectric core layer; and
    forming the cavity on the dielectric core layer.

3. The packaging process according to claim 1, wherein a method of forming the carrier comprises:
    providing a conductive core layer;
    forming the cavity on the conductive core layer; and
    forming a dielectric layer encapsulating the conductive core layer.

4. The packaging process according to claim 1, wherein the patterned conductive layer comprises a plurality of conductive lines extending from the inside of the cavity to the outside of the cavity, and each of the conductive lines comprises:
    a first pad located in the cavity;
    a second pad located outside the cavity; and
    a conductive trace extending from the inside of the cavity to the outside of the cavity, such that the conductive trace is connected between the first pad and the second pad, wherein the first pads and the second pads are exposed by the solder resist layer, and the at least one semiconductor device is electrically connected to the first pads.

5. The packaging process according to claim 1, wherein the at least one semiconductor device is electrically connected to the patterned conductive layer through a plurality of conductive bumps.

6. The packaging process according to claim 5, further comprising:
    forming an underfill material between the at least one semiconductor device and the carrier, so as to encapsulate the conductive bumps.

7. The packaging process according to claim 1, wherein the at least one semiconductor device comprises a first semiconductor device and a second semiconductor device, the at least one tapered extension structure comprises a first tapered extension structure and a second tapered extension structure, and a method of electrically connecting the first and second semiconductor devices to the patterned conductive layer comprises:
    stacking the first semiconductor device and the second semiconductor device on the patterned conductive layer in the cavity, wherein a first back surface of the first semiconductor device and a second back surface of the second semiconductor device face the carrier;
    forming the first and second tapered extension structures in the cavity, wherein the first tapered extension structure has a first inclined layout surface extending from a first active surface of the first semiconductor device to a bottom surface of the cavity, and the second tapered extension structure has a second inclined layout surface extending from a second active surface of the second semiconductor device to the first active surface; and
    forming a plurality of connecting traces on the second active surface, the second inclined layout surface, the first active surface, the first inclined layout surface, and the bottom surface through three-dimensional printing, such that the connecting traces are electrically connected between the first and second semiconductor devices and the patterned conductive layer in the cavity.

8. The packaging process according to claim 1, further comprising:
    forming a packaging material in the cavity to encapsulate the at least one semiconductor device.

9. The packaging process according to claim 8, wherein the cavity is filled with the packaging material.

10. The packaging process according to claim 8, further comprising:
    forming an external circuit on the packaging material and the carrier outside the cavity, wherein the external circuit is electrically connected to the patterned conductive layer.

11. The packaging process according to claim 1, further comprising:

forming an external circuit on the carrier outside the cavity, wherein the external circuit is electrically connected to the patterned conductive layer.

12. A semiconductor device package comprising:
   a carrier having a cavity;
   a patterned conductive layer;
   a solder resist layer covering the patterned conductive layer, wherein the patterned conductive layer and the solder resist layer extend from an inside of the cavity to an outside of the cavity, and one portion of the patterned conductive layer is exposed by the solder resist layer;
   a first semiconductor device mounted on the patterned conductive layer in the cavity, wherein the first semiconductor device has a first back surface facing the carrier and a first active surface opposite to the first back surface;
   a first tapered extension structure disposed on a bottom surface of the cavity, the first tapered extension structure having a first inclined layout surface extending from the first active surface to the bottom surface; and
   a plurality of connecting traces on the first active surface, the first inclined layout surface, and the bottom surface, such that the connecting traces are electrically connected between the first semiconductor device and the patterned conductive layer in the cavity.

13. The semiconductor device package according to claim 12, wherein the first inclined layout surface comprises a plane or a curved surface.

14. The semiconductor device package according to claim 12, further comprising:
   a second semiconductor device stacked on the first active surface, wherein the second semiconductor device has a second back surface facing the carrier and a second active surface opposite to the second back surface; and
   a second tapered extension structure disposed on the first active surface, the second tapered extension structure having a second inclined layout surface connecting the second active surface and the second active surface, wherein the connecting traces are further disposed on the second active surface and the second inclined layout surface, and the connecting traces are electrically connected between the first semiconductor device and the second semiconductor device.

15. The semiconductor device package according to claim 14, wherein the second inclined layout surface comprises a plane or a curved surface.

* * * * *